United States Patent
Baldwin et al.

(10) Patent No.: US 8,633,092 B2
(45) Date of Patent: Jan. 21, 2014

(54) QUANTUM WELL DEVICE

(71) Applicants: Kirk William Baldwin, Murray Hill, NJ (US); Loren N. Pfeiffer, Morristown, NJ (US); Kenneth William West, Mendham Township, NJ (US)

(72) Inventors: Kirk William Baldwin, Murray Hill, NJ (US); Loren N. Pfeiffer, Morristown, NJ (US); Kenneth William West, Mendham Township, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/712,179

(22) Filed: Dec. 12, 2012

(65) Prior Publication Data

US 2013/0130474 A1 May 23, 2013

Related U.S. Application Data

(62) Division of application No. 12/789,987, filed on May 28, 2010, now Pat. No. 8,362,461.

(60) Provisional application No. 61/183,473, filed on Jun. 2, 2009.

(51) Int. Cl.
| | |
|---|---|
| *H01L 21/20* | (2006.01) |
| *H01L 29/15* | (2006.01) |
| *H01L 33/00* | (2010.01) |

(52) U.S. Cl.
USPC .............. 438/468; 438/478; 257/14; 257/17; 257/E29.072; 257/E29.076; 257/E33.008; 257/E21.09

(58) Field of Classification Search
USPC .............. 438/468, 478; 257/14, 17, E29.072, 257/E29.076, E33.008, E21.09
See application file for complete search history.

(56) References Cited

U.S. PATENT DOCUMENTS

| | | | | |
|---|---|---|---|---|
| 7,282,732 | B2 * | 10/2007 | Gray et al. ...................... | 257/14 |
| 7,960,714 | B2 * | 6/2011 | Baldwin et al. ................. | 257/14 |
| 2002/0079485 | A1 * | 6/2002 | Stintz et al. .................... | 257/14 |
| 2004/0175852 | A1 * | 9/2004 | Ooi et al. ........................ | 438/22 |
| 2005/0116215 | A1 * | 6/2005 | Hooper et al. .................. | 257/14 |
| 2005/0184285 | A1 * | 8/2005 | Friesen et al. .................. | 257/14 |
| 2005/0199870 | A1 * | 9/2005 | Gray et al. ...................... | 257/14 |
| 2007/0138489 | A1 * | 6/2007 | Hooper et al. .................. | 257/94 |
| 2009/0315018 | A1 * | 12/2009 | Hudait et al. ................... | 257/24 |

* cited by examiner

*Primary Examiner* — Victor A Mandala
(74) *Attorney, Agent, or Firm* — J. F. McCabe

(57) ABSTRACT

An apparatus includes a primary planar quantum well and a planar distribution of dopant atoms. The primary planar quantum well is formed by a lower barrier layer, a central well layer on the lower barrier layer, and an upper barrier layer on the central well layer. Each of the layers is a semiconductor layer. One of the barrier layers has a secondary planar quantum well and is located between the planar distribution of dopant atoms and the central well layer. The primary planar quantum well may be undoped or substantially undoped, e.g., intrinsic semiconductor.

7 Claims, 5 Drawing Sheets

QUANTUM WELL DEVICE

This application is a divisional of application Ser. No. 12/789,987, filed May 28, 2010, which both claims the benefit of provisional application No. 61/183,473, filed Jun. 2, 2009, and is a continuation-in-part of application Ser. No. 12/317,436, filed Dec. 23, 2008, which claims the benefit of provisional application No. 61/201,717, filed Dec. 12, 2008.

BACKGROUND

1. Technical Field

The inventions generally relate to semiconductor quantum well devices and methods of fabricating and utilizing such devices.

2. Discussion of Related Art

This section introduces aspects that may be helpful to facilitating a better understanding of the inventions. Accordingly, the statements of this section are to be read in this light and are not to be understood as admissions about what is in the prior art or what is not in the prior art.

Various types of quantum well devices have been developed. Various planar quantum well devices include a semiconductor well layer and a semiconductor barrier layer on each side of the well layer. The semiconductor barrier layers confine mobile charge carriers, i.e., electrons or holes, to a two-dimensional (2D) layer, The confinement typically results, because the semiconductor well layer has a narrower band gap than the semiconductor barrier layers. For that reason, the conduction band may have a lower bottom edge in the semiconductor well layer and/or the valence band may have a higher upper edge in the semiconductor well layer. The band edge discontinuities can function as barriers that substantially confine the mobile charge carriers to the planar regions of the quantum wells.

SUMMARY

In one embodiment, an apparatus includes a primary planar quantum well and a planar distribution of dopant atoms. The primary planar quantum well is formed by a lower barrier layer, a central well layer on the lower barrier layer, and an upper barrier layer on the central well layer. Each of the layers is a semiconductor layer. One of the barrier layers has a secondary planar quantum well and is located between the planar distribution of dopant atoms and the central well layer. The primary planar quantum well may be undoped or substantially undoped, e.g., intrinsic semiconductor.

In another embodiment, a method includes forming a primary planar quantum well by growing a semiconductor lower barrier layer over a crystalline substrate, growing a semiconductor central well layer on the lower barrier layer, and growing a semiconductor upper harrier layer on the central well layer. The method also includes funning a planar distribution of dopant atoms above the substrate. The growing of one of the barrier layers includes forming a secondary planar quantum well therein. The planar distribution of dopant atoms is located above or below the primary planar quantum well.

In another embodiment, a method includes applying crossed electric and magnetic fields across a planar quantum well multilayer structure to cause a current to flow therein. The multilayer structure includes a primary quantum well formed by lower barrier layer, a central well layer on the lower barrier layer, and an upper barrier layer on the central well layer. Each layer is a semiconductor layer, and one of the barrier layers has a secondary planar quantum well therein. The multilayer structure also includes a planar distribution of dopant atoms, and the one of the barrier layers is located between the planar distribution and the central well layer.

BRIEF DESCRIPTION OF THE FIGURES

The invention can be better understood with reference to the following figures.

Figure 1:
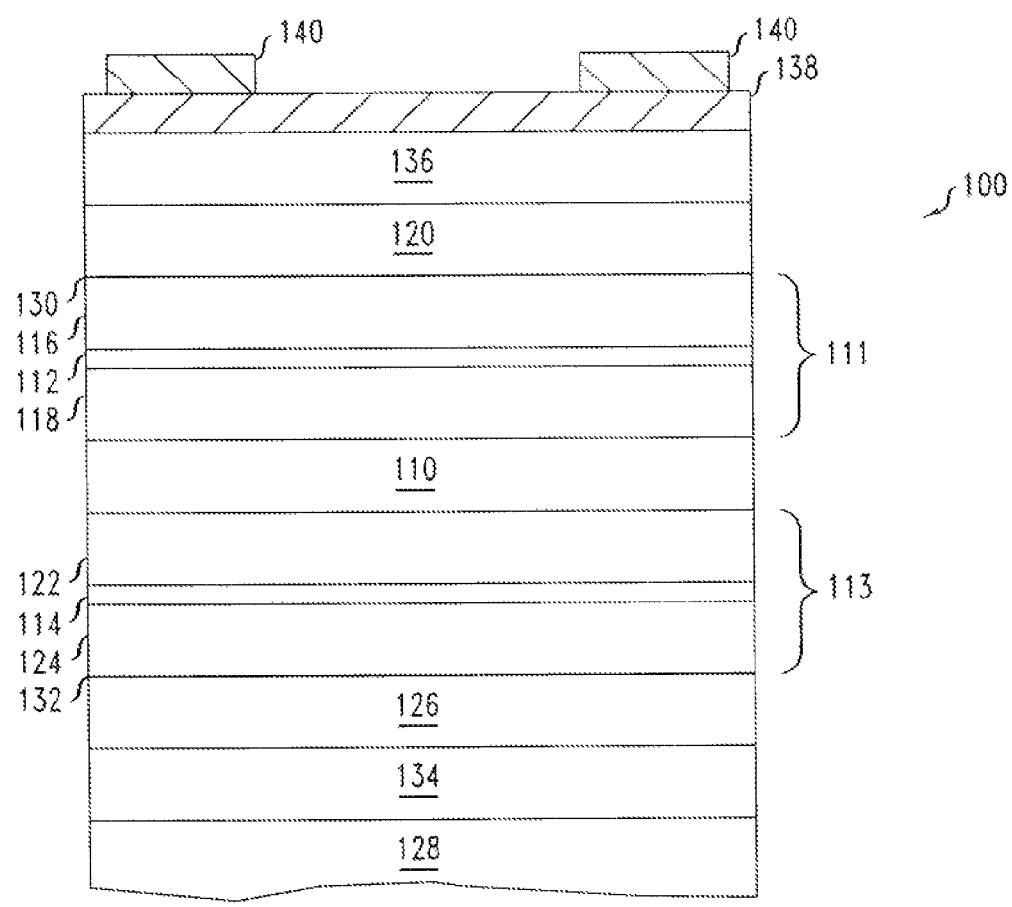
FIG. 1 is a cross-sectional view illustrating an embodiment of a planar quantum well structure.

In the figures, some features and/or elements may not be drawn to scale to better illustrate the embodiments being described.

In the figures, like reference numerals designate features with similar or the same structure and/or function.

In light of the disclosure herein, other apparatus and methods will be apparent to persons of skill in the art. Such additional apparatus and methods are intended to be within the scope of the inventions as defined by the accompanying claims.

DETAILED DESCRIPTION

Planar quantum well structures may be used to confine mobile charge carriers to two-dimensional (2D)) layers in various types of electronic devices. Examples of such electronic devices include electrically pumped optical lasers and active electronic circuit components. Examples of such electronic devices also include top-gated planar structures that can laterally control 2D droplets of mobile charge carriers at low enough temperatures and strong enough magnetic fields. These later electronic devices may be used to observe states of the integer quantum Hall effect (IQHE) and the fractional quantum Hall effect FQHE and/or to manipulate excitations thereof.

Planar semiconductor devices often include a pseudo-random spatial distribution of ionized dopant atoms. The ionized dopant atoms are left behind when charge carriers are thermally excited from the dopant atoms thereby producing mobile charge carriers in the devices. The static electric fields of such ionized dopant atoms may strongly disturb the form of a planar quantum well structure. Indeed, such ionized dopant atoms can disturb mobile charge carriers, e.g., electrons or holes, which are confined to a planar quantum well, so that these mobile charge carriers do not behave as charge carriers confined to a laterally uniform planar quantum well.

To reduce such disturbances, various embodiments provide planar quantum well structures in which a primary well layer is partially screened from the electrical fields of such ionized dopant atoms. In particular, the planar quantum well structures include secondary planar quantum well(s) with lower densities of mobile charge carriers. The secondary planar quantum well(s) partially screen such disturbing electric fields by being located between the primary well layer and the ionized dopant atoms. The mobile charge carriers of the secondary quantum wells can spatially rearrange themselves to produce the screening or partial screening of such electric fields thereby causing the mobile charge carriers in the primary quantum well to feel effective potentials that more closely approach those of ideal 2D quantum wells, e.g., more laterally uniform potentials.

Various embodiments provide planar quantum well structures in which the primary quantum well layer is substantially undoped, i.e., intrinsically doped or unintentionally doped semiconductor. For this reason, there is a substantial absence of ionized dopant atoms with electric fields that would be unscreened for mobile charge carriers in the primary planar quantum well. The quantum well structures are modulation doped so that dopant atoms are substantially located outside of the primary planar quantum well, e.g., except for unintentional or intrinsic levels of dopant atoms. In addition, one or more of the barrier layers of the primary planar quantum well has one or more narrow secondary planar quantum wells therein. Each secondary planar quantum well is narrow so that it confines a charge carrier density that has a much lower mobility than the charge carrier density confined to the primary planar quantum well. For that reason, mobile charge carriers of the secondary planar quantum well(s) may not substantially add to the conduction produced by mobile charge carriers of the primary quantum well. But, each secondary planar quantum well is configured to confine a sufficiently high density of mobile charge carriers to substantially screen the electrical fields of the ionized dopant atoms located outside the primary planar quantum well. For these reasons, the mobile charge carriers of the primary quantum well feel an effective potential better approximating that of a laterally uniform 2D quantum mechanical well.

FIG. 1 illustrates one embodiment of such a planar quantum well structure 100. The planar quantum well structure 100 is formed on a planar surface of a substrate 128, e.g., a substantially lattice matched crystalline semiconductor substrate.

The planar quantum well structure 100 includes a primary quantum well with a central well layer 110, an upper barrier multilayer 111, and a lower barrier multilayer 113. The central quantum well layer 110, and the upper and lower barrier multilayers 111, 113 are formed of intrinsic or not-intentionally doped semiconductor, e.g., group III-V semiconductor. Herein, "upper layer" refers to a layer farther from the substrate 128 than any lower layer(s), and upper and lower refer to positions respectively above and below the central well layer 110.

The upper barrier multilayer 111 includes top and bottom barrier layers 116, 118 that surround a narrow upper screening well layer 112. The upper barrier multilayer 111 is configured to be both a barrier of the primary planar quantum well and a narrow secondary planar quantum well that partially screens the primary quantum well layer 110 from the electric fields of ionized dopant atoms located above the upper barrier multilayer 111.

The lower barrier multilayer 113 includes top and bottom barrier layers 122, 124 that surround a narrow lower screening well layer 114. The lower barrier multilayer 113 is configured to be both a barrier of the primary planar quantum well and a narrow secondary planar quantum well that partially screens the primary quantum well layer 110 from electric fields of ionized dopant atoms located below the lower barrier multilayer 113.

In the upper and lower barrier multilayers 111, 113, the screening well layers 112, 114 are typically substantially narrower than in the central well layer 110, e.g., five or more times narrower. For that reason, the lowest energy level is typically higher in the secondary planar quantum wells than in the primary planar quantum well. Thus, densities of thermally excited mobile charge carriers are substantially typically lower in the screening well layers 112, 114 than in the central well layer 110.

The planar quantum well structure 100 also includes thin upper and lower planar doped regions 130, 132 that are located both next to the respective the upper and lower barrier multilayers 111, 113 and outside of the primary planar quantum well. The upper planar doped region 130 is interposed between the top barrier layer 116 and an upper isolation layer 120 of group III-V semiconductor. The lower planar doped region 132 is interposed between the bottom barrier layer 124 and a lower isolation layer 126 of group III-V semiconductor.

In the doped regions 130, 132, planar densities of dopant atoms are typically sufficient to replace one atom in a small fraction of the unit cells of a monolayer. Exemplary planar densities of dopant atoms may be between about $5\times10^{11}$ and about $5\times10^{12}$ mobile electrons per $cm^2$ in each planar doped region 130, 132. For example, there may be about $3\times10^{14}$ Ga atoms per centimeter-squared in a GaAs monolayer so that $1/1,000$ of the gallium therein is replaced by silicon, which corresponds to about $3\times10^{11}$ silicon atoms per centimeter-squared of layer surface. The dopant atom density may be about 3 or 4 times higher in the upper planar dopant region 130 than in the lower planar dopant region 132 to also provide for the neutralization of dangling bonds at the exposed upper semiconductor surface of the planar quantum well structure 100.

The densities of dopant atoms in the planar doped regions 130, 132 may be selected, e.g., to substantially saturate the lowest energy level of the primary planar quantum well with mobile charge carriers without filling or partially filling higher energy levels thereof To obtain such a dopant configuration, the densities of dopant atoms in the planar dopant regions 130, 132 can be estimated through numerical calculations of the energy levels of the planar quantum well structure 100. To perform such calculations, a person of skill in the art may use, e.g., a publicly available computer program, e.g., the program titled "1D Poisson", which is available as freeware at the online site http://www.nd.edu~gsnider/ of Professor Gregory Snider of the Department of Electrical Engineering, University of Notre Dame, Notre Dame, Ind. 46556 US.

Due to the substantial restriction of dopant atoms to the upper and lower planar doped regions 130, 132, the planar quantum well structure 100 is a modulation doped structure in which the primary planar quantum well is substantially undoped, e.g., formed of intrinsic or non-intentionally-doped group III-V semiconductor layers. Thus, the upper and lower planar doped regions 130, 132 provide mobile charge carriers for the primary planar quantum well without a significant number of ionized dopant atoms being located in the primary planar quantum well. In addition, the upper and lower planar dopant regions 130, 132 are vertically separated from the central well layer 110 by a substantial distance so that the ionized dopant atoms less perturb the planar gas of mobile charge carriers that is substantially confined to the central well layer 110. The ionized dopant atoms might otherwise undesirably disturb the behavior of the mobile charge carriers in the primary planar quantum well.

The planar quantum well structure 100 may also include the group III-V semiconductor lower isolation layer 126 and/or a group III-V semiconductor transition layer 134 located between the primary planar quantum well and the substrate 128. The planar quantum well structure 100 may also include one or more group III-V semiconductor upper isolation layers 120, 136 located above the primary quantum well. The upper and lower isolation layers 120, 136, 126 and the transition layer 134 isolate the planar doped regions 130, 132 from the upper free surface of the quantum well structure 100 and the substrate 128.

In some embodiments, the planar quantum well structure 100 may include a top dielectric layer 138 that covers or partially covers and electrically insulates the top semiconductor surface of the planar quantum well structure 100. For example, the top insulating layer may be about 400 Å or less of a conventional dielectric such as silicon nitride.

In some embodiments, the planar quantum well structure 100 may include one or more operating electrodes 140 located over lateral portions of its top semiconductor surface, e.g., on the top dielectric layer 138. The operating electrodes 140 may be metallic layers or multilayers, e.g., formed via conventional deposition processes and/or lithographic patterning processes. For example, the top operating electrodes 36 may be evaporation-deposited aluminum (Al) with a thickness of about 60 nm that were deposited on a resist patterned surface and then patterned by a lift off of the resist to remove excess aluminum.

In further embodiments (not shown), the planar quantum well structure 100 may include multiple narrow planar screening wells in the upper barrier multilayer 111 and/or in the lower barrier multilayer 113 (not shown).

Figure 2:
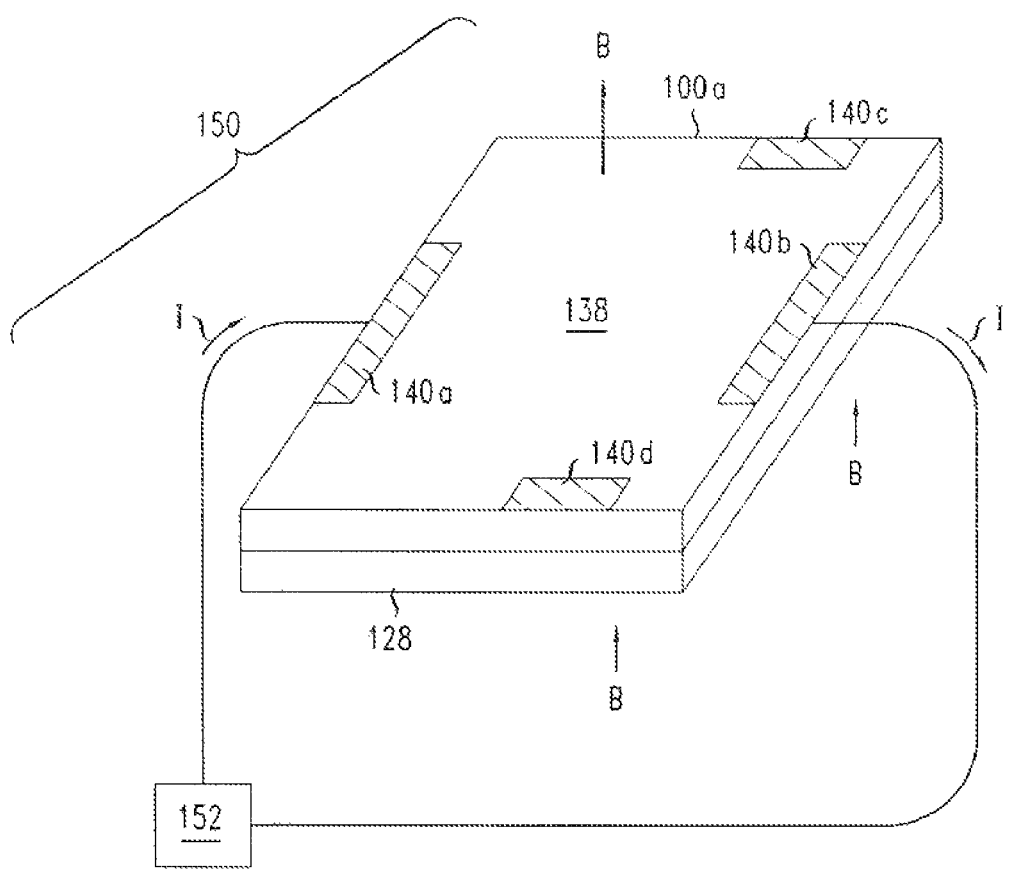
FIG. 2 is a perspective view illustrating an embodiment of an electronic apparatus that includes a multilayer structure for a planar quantum well, e.g., the planar quantum well structure illustrated in FIG. 1.

FIG. 2 schematically illustrates a portion of an apparatus 150 that incorporates a planar quantum well structure 100a, e.g., the planar quantum well structure 100 of FIG. 1. The apparatus 200 includes an external electrical circuit 152 for passing an electrical current, I, through the quantum well structure via top electrodes 140a, 140b and an apparatus (not shown) connected to measure a voltage transverse to the flow of said current, I, via to the electrodes 140c, 140d. The apparatus 150 may be located in a magnetic field, B, e.g., with a direction perpendicular to the plane of the planar quantum well structure 100a. The electrodes 140a-140d may have different shapes and/or different locations along the top surface of the planar quantum well structure 100a.

U.S. patent application Ser. No. 12/317,436, which was filed on Dec. 23, 2008 by Kirk Baldwin et at is incorporated herein by reference in its entirety. The above-incorporated U.S. patent application describes devices that can operate at temperatures below about 0.1° K., e.g., to confine and/or manipulate FQHE droplets of mobile charge carriers in a planar quantum well. Some such devices may use the apparatus 100a of FIG. 2 to confine and/or manipulate such FQHE droplet(s) and low energy excitations therein. For example, some such devices may be used to manipulate such FQHE droplets to perform quantum computing operations on low energy excitations therein.

Figure 3:
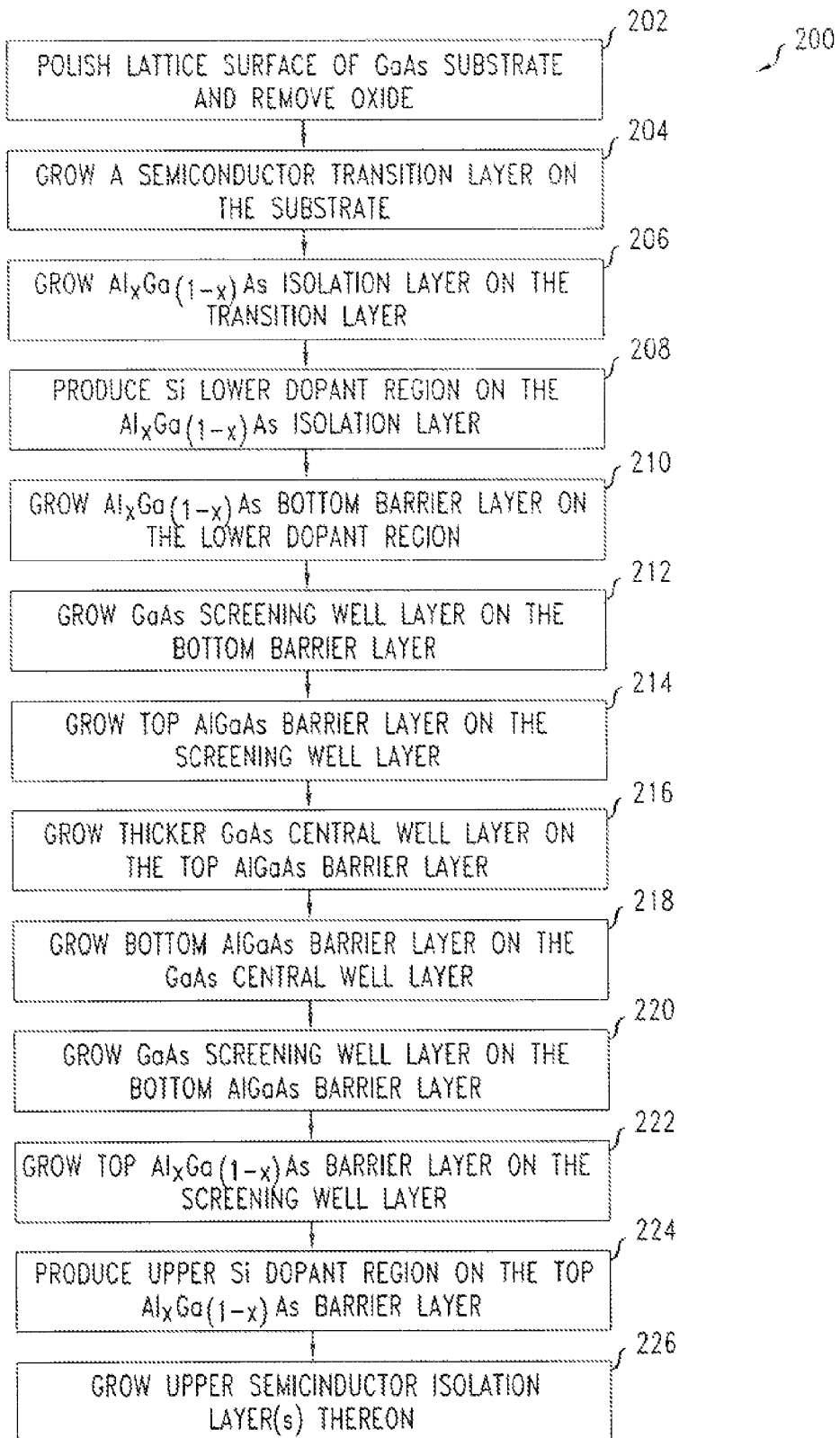
FIG. 3 is a flow chart illustrating a method of fabricating one embodiment of a multilayer structure for the planar quantum well structure illustrated by FIG. 1.

FIG. 3 illustrates an embodiment of a method 200 for fabricating an example planar quantum well structure, e.g., the planar quantum well structures 100, 100a of FIGS. 1-2.

The method 200 includes polishing a (110) or (100) lattice surface of a crystalline gallium arsenide (GaAs) substrate, e.g., the substrate 128 of FIG. 1, so that the surface is substantially atomically flat and heating said GaAs substrate 128 under a vacuum at about 600° C. to remove oxide thereon (step 202).

The method 200 includes epitaxially growing a transition layer, e.g., the transition layer 134 of FIG. 1, on the (110) or (100) lattice surface of the crystalline GaAs substrate (step 204). From bottom-to-top, the transition layer may have about 5000 angstroms (Å) of GaAs and a stack of approximately identical bilayers thereon. Each bilayer has a bottom layer of about 113 Å of GaAs and a top layer of about 5.66 Å of aluminum arsenide (AlAs). The stack may include, e.g., about 600 Or more of the bilayers.

The method 200 includes epitaxially growing a lower isolation layer, e.g., the lower isolation 126 of FIG. 1, on the transition layer (step 206). The lower isolation layer may be, about 1,100 Å of $Al_xGa_{(1-x)}As$ in which the alloy parameter x is about 0.323. The epitaxial growth of the lower isolation layer may be performed, e.g., at a substrate temperature of about 647.6° C.

The method 200 includes producing a lower planar dopant region, e.g., the lower planar dopant region 132 of FIG. 1, on the lower isolation layer (step 208). Producing the lower planar dopant region may involve depositing Si atoms on the $Al_xGa_{(1-x)}As$ lower isolation layer, e.g., at about the same substrate temperature, so that the Si-atoms replace some atoms Ga and/or Al atoms) at the top surface of the lower isolation layer. Thus, the deposited Si atoms will be in a thin layer, e.g., the top one or few monolayers of the $Al_xGa_{(1-x)}As$ lower isolation layer. In the lower planar dopant region, a Si atom may replace about 1 to 10 Ga and/or Al atoms out of 10,000 unit cells. Since replacements of Si for atoms of the $Al_xGa_{(1-x)}As$ unit cells are rare, the lateral spatial distribution of Si atoms will be pseudo-random along the top surface of the lower isolation layer.

Next, the method 200 includes performing steps 210, 212, and 214 to produce a lower barrier multilayer, e.g., the lower barrier multilayer 113 of FIG. 1. The lower barrier multilayer will function as both a barrier of the primary planar quantum well and a secondary quantum well for a low density of mobile screening charge carriers. The lower barrier multilayer includes, e.g., the bottom barrier layer 124, the narrow screening well layer 114, and the top barrier layer 122, which may itself be a multilayer, as shown in FIG. 1.

The step 210 involves epitaxially growing a bottom barrier layer on the lower planar dopant region and the lower isolation layer by performing two sub-steps. In the first sub-step, an epitaxial growth produces a thin layer of about 14 Å of the same $Al_xGa_{(1-x)}As$ alloy (i.e., x≅0.323) on the lower dopant region and lower isolation layer while the substrate is maintained at a lower temperature, e.g., about 490.6° C. or lower. This thin $Al_xGa_{(1-x)}As$ layer may significantly reduce vertical migration of the Si dopant atoms during a subsequent higher temperature epitaxial growth. In the second sub-step, an epitaxial growth produces a layer of about 146 Å of the same $Al_xGa_{(1-x)}As$ alloy (i.e., x≅0.323) on the thin $Al_xGa_{(1-x)}As$ layer produced by the first sub-step. The second sub-step is performed at a higher substrate temperature, e.g., about 654.1° C.

The step 212 involves epitaxially growing a narrow screening well layer on the bottom barrier layer 124, e.g., at about the same substrate temperature of about 654.1° C. The narrow screening well layer 114 is a GaAs layer and may have a thickness of about 15 Å or less.

The step 214 involves epitaxially growing a top barrier layer, i.e., a bilayer, on the narrow screening well layer, e.g., at about the same substrate temperature of about 654.1° C. The top barrier bilayer has a bottom layer of about 140 Å of $Al_xGa_{(1-x)}As$, i.e., with an alloy parameter x of about 0.323, and a top layer of about 480 Å of $Al_yGa_{(1-y)}As$, i.e., with an alloy parameter y of about 0.243.

The method 200 involves epitaxially growing a central well layer for the primary planar quantum well, e.g., the central well layer 110 of FIG. 1, on the lower barrier multilayer, e.g., at about the same substrate temperature of about 654.1° C. (step 216). The central well layer will be much thicker than the screening well layers of the secondary planar quantum wells, e.g., five or more times thicker or even ten or more times thicker. For that reason, the mobile carrier density will be much higher in the resulting primary planar quantum well than in the resulting secondary planar screening quantum wells. For example, the central well layer may be, e.g., a GaAs layer with thickness of about 240 Å.

Next, the method 200 involves performing steps 218, 220, and 222 to produce an upper barrier multilayer, e.g., the upper barrier multilayer 111 of FIG. 1, The upper barrier multilayer functions as both a barrier of the primary planar quantum well and a secondary planar quantum well confining a relatively lower density of mobile screening charges. The upper barrier multilayer includes the bottom barrier layer 118, the screening well layer 112, and the top barrier layer 116.

The step 218 involves epitaxially growing the bottom barrier layer, i.e., a bilayer, substantially as described in the above step 214 and at a substrate temperature of about 654.1° C., except that the order of the layers in the barrier bilayer are interchanged. In this barrier layer, the bottom layer is about 480 Å of $Al_yGa_{(1-y)}As$, i.e., with an alloy parameter y of about 0.243, and the top layer is about 140 Å of $Al_xGa_{(1-x)}As$, i.e., with an alloy parameter x of about 0.323.

The step 220 involves epitaxially growing a narrow GaAs screening well layer on the bottom barrier layer, e.g., at about the same substrate temperature of about 654.1° C. The GaAs screening well layer may have a thickness of about 15 Å or less, e.g., a layer similar to the lower screening well layer produced in the above step 212.

The step 222 involves epitaxially growing the top barrier layer on the GaAs screening well layer e.g., at about the same substrate temperature of about 654.1° C. The top barrier layer may be about 160 Å of the same of $Al_xGa_{(1-x)}As$ in which the alloy parameter x satisfies x≅0.323.

The method 200 includes producing an upper dopant region, e.g., the upper dopant region 130 of FIG. 1, on the upper barrier multilayer that was produced at the steps 218, 220, and 222 (step 224). The upper dopant region may be produced by substantially the same process used to produce the lower dopant region at the step 208. As a result, Si atoms will replace Ga and/or Al atoms of some unit cells at the top one or few monolayers of the upper most $Al_xGa_{(1-x)}As$ layer. In the upper dopant region, a Si atom may replace about 1 to 10 atoms in 10,000 unit cells or several times that number of atoms to form a pseudo-random planar spatial distribution of Si dopant atoms.

The method 200 includes performing a sequence of sub-steps to produce an epitaxial growth of one or more group III-V semiconductor upper isolation layers, e.g., the isolation layers 120, 136 of FIG. 1, on the upper barrier multilayer and upper dopant region (step 226). The first sub-step involves epitaxially growing a thin layer of about 14 Å of the same $Al_xGa_{(1-x)}As$ (i.e., x is about 0.323) on the upper barrier multilayer at a low substrate temperature, e.g., about 487.9° C. or lower. This thin $Al_xGa_{(1-x)}As$ layer may impede vertical migration of the Si dopant atoms during a higher temperature, subsequent epitaxial growth. The second sub-step involves epitaxially growing a much thicker layer of the same $Al_xGa_{(1-x)}As$, e.g., about 866 Å, on the thin $Al_xGa_{(1-x)}As$ layer at a higher substrate temperature, e.g., about 649° C. These sub-steps complete the fabrication of the upper isolation layer 120 of FIG. 1. The third sub-step involves epitaxially growing a layer of about 100 Å of GaAs on the $Al_xGa_{(1-x)}As$ layer, e.g., at about the same substrate temperature. This third sub-step completes the fabrication of the upper isolation layer 136 of FIG. 1.

The method 200 may also include then, performing a conventional deposition process to produce the dielectric layer 136 of FIG. 1, e.g., a silicon nitride layer (not shown in FIG. 3).

The method 200 may also include then, performing a conventional mask-controlled metal deposition and a conventional patterning process to produce the patterned metal electrodes 140 of FIG. 1 (not shown in FIG. 3), e.g., electrodes of aluminum or another elemental or alloy metal.

Figure 4:
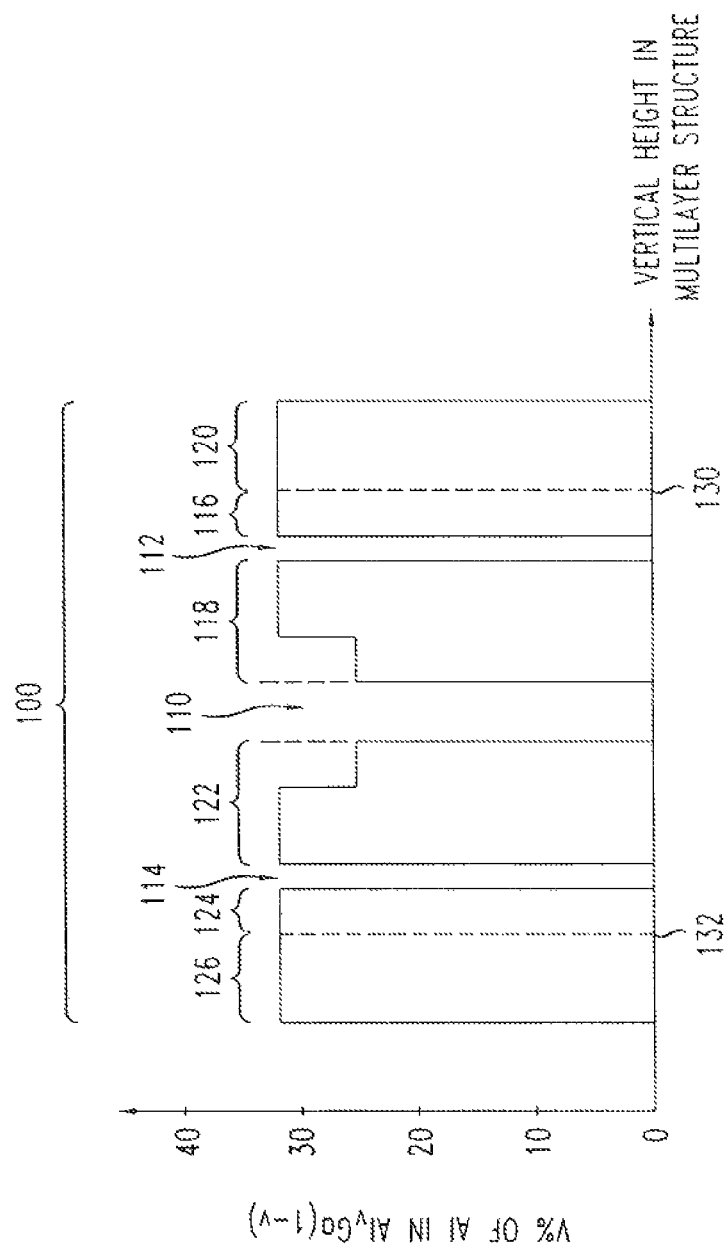
FIG. 4 illustrates the concentration of aluminum (Al) in a vertical portion of the multilayer structure fabricated by the method of FIG. 3.

FIG. 4 graphs aluminum percentages in the various $Al_vGa_{(1-v)}As$ semiconductor alloys in a vertical portion of the embodiment of the planar quantum well structure 100 of FIG. 1 when fabricated by the method 200 of FIG. 3. The energy of the lower edge of the conduction band is believed to be monotonic in the concentration of Al in alloys of the form $Al_zGa_{(1-z)}As$. For that reason, the Al percentages of FIG. 4 also qualitatively illustrate the vertical topography of the effective potential that mobile electrons would experience in such embodiments of the planar quantum well structure 100. From FIG. 4, it is clear that the vertical profile of the effective potential seen by mobile electrons includes low potential energy regions in the narrow upper and lower screening well layers 112, 114 and in the central well layer 110.

Figure 5:
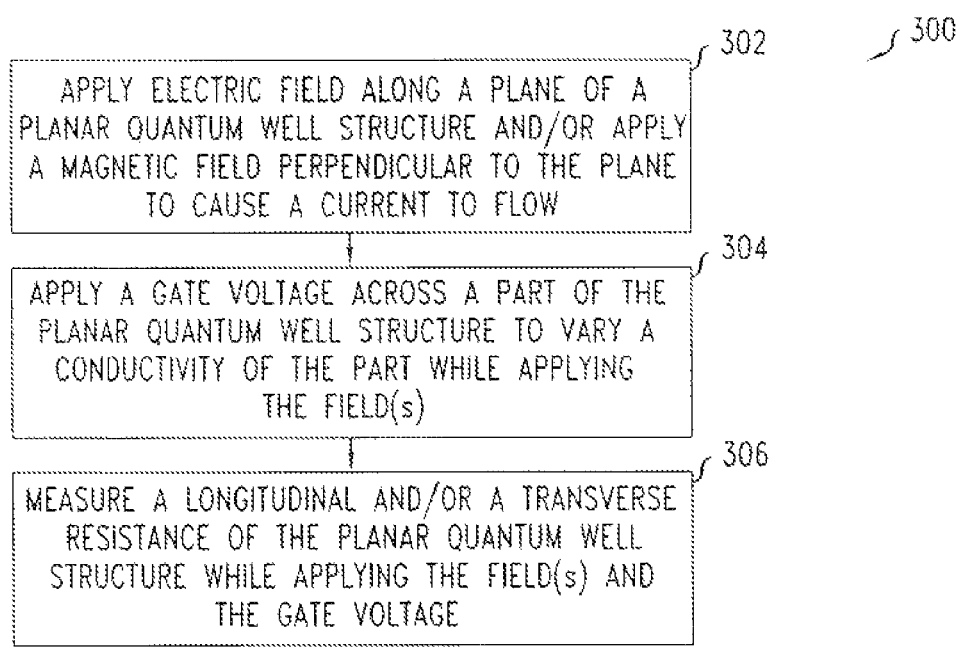
FIG. 5 is a flow chart illustrating a method of using an apparatus with a planar quantum well structure, e.g., apparatus according to FIGS. 1, 2, and/or 4.

FIG. 5 illustrates an example of a method 300 of using an apparatus with a planar quantum well structure, e.g., apparatus of FIGS. 1, 2, and/or 4.

The planar quantum well structure includes a primary quantum well formed by semiconductor lower barrier layer, a semiconductor central well layer located on the lower barrier layer, and a semiconductor upper barrier layer located on the central well layer, e.g., the respective layers 113, 110, 111 of FIG. 1 Each barrier layer has a secondary planar quantum well therein. The structure includes one or two planar distributions of dopant atoms, e.g., the doped regions 130, 132 of FIG. 1. One of the barrier layers is located between cacti such planar distribution and the central well layer. Each secondary planar quantum well is formed of a bottom barrier layer, a second well layer on the bottom barrier layer, and a top barrier layer on the second well layer. Each second well layer is five or more times narrower than the central well layer of the primary planar quantum well or ten or more times narrower than the central well layer of the primary planar quantum well, e.g., to provide for charge screening without providing substantial conduction.

The method 300 includes applying an electric field along the planar quantum well structure and/or applying a magnetic field perpendicular to the planar quantum well structure to cause a current to flow therein (step 302). For example, the step 302 may be performed with simultaneously applied crossed electric and magnetic fields at temperatures below about 0.2 Kelvin to produce and/or manipulate a FQHE droplet. Alternately, the step 302 may be performed to cause an electrically controllable current to flow in the multilayer structure.

The method 300 includes applying a gate voltage across a part of the planar quantum well structure to vary a conductivity of the corresponding portion of the primary planar quantum well while applying the field(s) at step 302 (step 304).

The method 300 may include measuring a longitudinal resistance and/or a transverse resistance of the planar quantum well structure while applying the field(s) at the step 302 and/or at the gate voltage at step 304 (step 306).

For example, the method 300 may be used to perform manipulations of integer and/or fractional quantum Hall effect fluids and droplets thereof as described in above incorporated U.S. patent application Ser. No. 12/317,436, filed on Dec. 23, 2008 by Kirk Baldwin et al.

It will be understood that the foregoing description of various embodiments has been presented for illustration. This description is not exhaustive and does not limit the claimed invention to the illustrated embodiments. The inventions are intended to include modifications and variations that a person of skill in the art would understand to be possible in light of the above description.

What is claimed is:

1. A method, comprising:
   forming a primary planar quantum well by growing a semiconductor lower barrier layer over a crystalline substrate, growing a semiconductor central well layer on the lower barrier layer, and growing a semiconductor upper barrier layer on the central well layer; and
   forming a planar distribution of dopant atoms above the substrate; and
   wherein the growing of one of the barrier layers includes forming a secondary planar quantum well therein;
   wherein the planar distribution of dopant atoms is located above or below the primary planar quantum well;
   wherein the secondary planar quantum well is formed of a bottom barrier layer, a second well layer on the bottom barrier layer, and a top barrier layer on the second well layer; and
   wherein the second well layer is at least five times narrower than the central well layer of the primary planar quantum well.

2. The method of claim 1, wherein the primary planar quantum well is formed of undoped semiconductor.

3. The method of claim 1, wherein the growing of another of the barrier layers includes forming a secondary planar quantum well in the another of the barrier layers.

4. The method of claim 1, wherein the one of the barrier layers includes a plurality of secondary planar quantum wells therein.

5. The method of claim 1, further comprising:
   forming another planar distribution of dopant atoms above the substrate such that one of the planar distributions is located on each side of the primary planar quantum well.

6. The method of claim 1, wherein the central well layer and the barrier layers are formed of alloys of Group III-V semiconductors.

7. A method, comprises:
   applying crossed electric and magnetic fields across a planar quantum well multilayer structure to cause a current to flow in the multilayer structure; and
   wherein the structure includes a primary quantum well and a planar distribution of dopant atoms;
   wherein the primary quantum well is formed by semiconductor lower barrier layer, a semiconductor central well layer on the lower barrier layer, and a semiconductor upper barrier layer on the central well layer;
   wherein each barrier layer has a secondary planar quantum well therein and one of the barrier layers is located between the planar distribution of dopant atoms and the central well layer;
   wherein the secondary planar quantum well is formed of a bottom barrier layer, a second well layer on the bottom barrier layer, and a top barrier layer on the second well layer; and
   wherein the second well layer is at least five times narrower than the central well layer of the primary planar quantum well.

* * * * *